United States Patent
Lim et al.

(10) Patent No.: US 8,049,311 B2
(45) Date of Patent: Nov. 1, 2011

(54) ELECTRONIC COMPONENT AND METHOD FOR ITS PRODUCTION

(75) Inventors: Chee Chian Lim, Alor Gajah Malaka (MY); Yoke Chin Goh, Tangkak Johor (MY); Koh Hoo Goh, Muar Johor (MY); May Ting Hng, Bukit Baru Melaka (MY)

(73) Assignee: Infineon Technologies AG, Neubiberg (DE)

( * ) Notice: Subject to any disclaimer, the term of this patent is extended or adjusted under 35 U.S.C. 154(b) by 87 days.

(21) Appl. No.: 12/435,015

(22) Filed: May 4, 2009

(65) Prior Publication Data

US 2009/0250807 A1    Oct. 8, 2009

Related U.S. Application Data

(63) Continuation of application No. PCT/IB2006/003189, filed on Nov. 14, 2006.

(51) Int. Cl.
*H01L 21/00* (2006.01)

(52) U.S. Cl. ........ 257/659; 257/697; 257/700; 257/723; 257/E21.518; 257/E23.006; 257/E23.176; 257/E23.181; 257/E23.192; 257/E25.016

(58) Field of Classification Search ............ 257/70–723, 257/738, 779–799, E21.518, 23.006–23.007, 257/E25.003
See application file for complete search history.

(56) References Cited

U.S. PATENT DOCUMENTS

| | | | |
|---|---|---|---|
| 4,835,598 A * | 5/1989 | Higuchi et al. ............... 257/668 |
| 4,905,075 A * | 2/1990 | Temple et al. ................ 257/680 |
| 4,918,511 A | 4/1990 | Brown | |
| 5,202,288 A * | 4/1993 | Doering et al. ................. 29/827 |
| 5,208,188 A * | 5/1993 | Newman ........................ 156/310 |
| 5,409,866 A | 4/1995 | Sato et al. | |
| 5,497,033 A * | 3/1996 | Fillion et al. .................. 257/723 |
| 5,498,902 A | 3/1996 | Hara | |
| 5,604,978 A * | 2/1997 | Sherif et al. .................... 29/840 |
| 5,646,828 A * | 7/1997 | Degani et al. ................. 361/715 |
| 5,681,777 A * | 10/1997 | Lynch et al. ................... 29/827 |
| 5,889,654 A * | 3/1999 | Pierson et al. ............... 361/720 |
| 6,001,671 A * | 12/1999 | Fjelstad ........................ 438/112 |
| 6,020,597 A * | 2/2000 | Kwak ............................ 257/48 |
| 6,039,471 A * | 3/2000 | Wyland ........................ 374/43 |
| 6,072,228 A | 6/2000 | Hinkle et al. | |
| 6,104,089 A * | 8/2000 | Akram ......................... 257/723 |
| 6,166,430 A | 12/2000 | Yamaguchi | |
| 6,229,216 B1 * | 5/2001 | Ma et al. ....................... 257/777 |
| 6,239,487 B1 | 5/2001 | Park et al. | |
| 6,246,115 B1 * | 6/2001 | Tang et al. .................... 257/706 |
| 6,309,915 B1 * | 10/2001 | Distefano .................... 438/127 |
| 6,396,130 B1 | 5/2002 | Crowley et al. | |
| 6,455,936 B1 * | 9/2002 | Lo et al. ....................... 257/758 |

(Continued)

FOREIGN PATENT DOCUMENTS

JP    2005223005    8/2005

(Continued)

*Primary Examiner* — Michael Lebentritt
(74) *Attorney, Agent, or Firm* — Edell, Shapiro & Finnan, LLC

(57) ABSTRACT

An electronic component includes a number of leads and at least one cooling element. The bottom surface of the cooling element is exposed and the material of the cooling element is different from the material of the leads. At least one semiconductor chip is provided on the cooling element. An encapsulation compound covers at least part of the leads, at least part of the semiconductor chip(s), and at least part of the cooling element(s).

11 Claims, 2 Drawing Sheets

U.S. PATENT DOCUMENTS

| | | |
|---|---|---|
| 6,501,160 B1 | 12/2002 | Higuchi et al. |
| 6,501,164 B1 * | 12/2002 | Chen et al. .................... 257/686 |
| 6,590,281 B2 | 7/2003 | Wu et al. |
| 6,707,149 B2 * | 3/2004 | Smith .......................... 257/723 |
| 6,709,895 B1 * | 3/2004 | Distefano .................... 438/115 |
| 7,145,225 B2 * | 12/2006 | Lee ............................... 257/686 |
| 7,205,674 B2 * | 4/2007 | Huang et al. ................. 257/787 |
| 7,443,019 B2 * | 10/2008 | Bauer et al. .................. 257/692 |
| 7,508,066 B2 * | 3/2009 | Huang et al. ................. 257/707 |
| 7,683,477 B2 * | 3/2010 | Otremba ...................... 257/723 |
| 7,763,963 B2 * | 7/2010 | Hong ............................ 257/686 |
| 7,851,906 B2 * | 12/2010 | Alcoe et al. .................. 257/713 |
| 2001/0005044 A1 | 6/2001 | Fjelstad |
| 2002/0066954 A1 | 6/2002 | Huang et al. |
| 2004/0029312 A1 | 2/2004 | Knapp et al. |
| 2004/0094829 A1 | 5/2004 | Minamio et al. |
| 2004/0183188 A1 | 9/2004 | Oohama |
| 2005/0133824 A1 | 6/2005 | Hosokawa et al. |
| 2005/0173793 A1 | 8/2005 | Rohrmoser et al. |

FOREIGN PATENT DOCUMENTS

| | | |
|---|---|---|
| JP | 2005223005 A | 8/2005 |
| JP | 2006223005 | 8/2006 |
| KR | 2001058577 | 7/2001 |
| WO | 0193327 | 12/2001 |

\* cited by examiner

ELECTRONIC COMPONENT AND METHOD FOR ITS PRODUCTION

CROSS REFERENCE TO RELATED APPLICATIONS

This application is a continuation of International Application No. PCT/IB2006/003189, filed on Nov. 14, 2006, entitled "An Electronic Component and Method for its Production," the entire contents of which are hereby incorporated by reference.

FIELD OF THE INVENTION

This application relates to an electronic component such as a semiconductor chip package with at least one semiconductor chip.

BACKGROUND

An electronic component often comprises two or more semiconductor chips. Each semiconductor chip performs a specific function. For instance, a plurality of semiconductor chips in a mobile phone performs functions of processing, storing and transferring information between two users.

Enclosing a plurality of chips within a single package offers several advantages. This reduces the total chip package size, as a multi-chip package is usually smaller than a plurality of single-chip packages. Furthermore, the cost of assembly and testing of a single multi-chip package is often lower than with a plurality of single-chip packages. Multi-chip packaging typically encloses the complex interconnections between the semiconductor chips within the package. Thus, the connection of the multi-chip package to a substrate is a simpler process.

SUMMARY

An electronic component includes a number of leads and at least one cooling element. The bottom surface of the cooling element is exposed and the material of the cooling element is different from the material of the leads. At least one semiconductor chip is provided on the cooling element. An encapsulation compound covers at least part of the leads, at least part of the semiconductor chip(s), and at least part of the cooling element(s).

The above and still further features and advantages of the present invention will become apparent upon consideration of the following definitions, descriptions and descriptive figures of specific embodiments thereof, wherein like reference numerals in the various figures are utilized to designate like components. While these descriptions go into specific details of the invention, it should be understood that variations may and do exist and would be apparent to those skilled in the art based on the descriptions herein.

DETAILED DESCRIPTION

Figure 1:
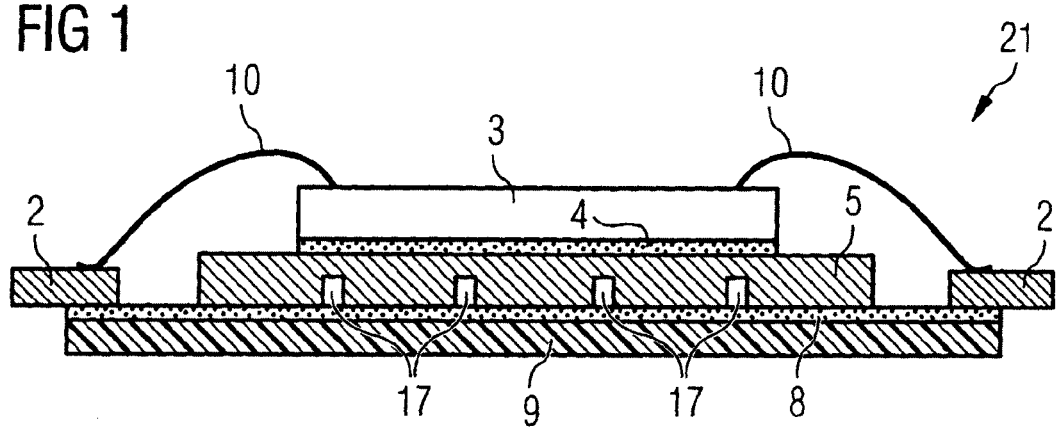
FIG. 1 illustrates a cross-sectional view of an electronic component with a first heat sink.

An electronic component comprises a plurality of leads and at least one cooling element. At least one semiconductor chip is placed on the cooling element. An encapsulation compound covers at least part of the leads, at least part of the semiconductor chip or the semiconductor chips, and at least part of the cooling element or the cooling elements.

The cooling element is also known as heat sink. The bottom surface of the cooling element is exposed. The material of the cooling element is different from the material of the leads. The difference can be in class such as ceramics and metal or in composition of material or in different alloys within the same class.

It is believed that an electronic component with an exposed cooling element or heat sink has an improved thermal dissipation. The cooling element dissipates heat generated by the semiconductor chip during application, and exposing the cooling element enhances the dissipation of heat. The difference of material between the cooling element and the leads may allow the cooling element and the leads to provide different features. The leads may provide good electrical conductivity whilst the cooling element may provide good thermal conductivity as well as low mechanical stress between the cooling element and the semiconductor chip.

The cooling element need not be connected to the leads. This may facilitate the adaptation of the cooling element during production of the electronic component. The adaptation may be in type, size, or shape. The electronic component often has functional or electrical parameter design faults during the initial production, which surface during production or application. The rectification of these faults may require an adaptation of the cooling element. For this and other reasons, it is advantageous that the cooling element can be easily adapted.

Several configurations of the electronic component are possible. In a first configuration, the electronic component comprises one cooling element and one semiconductor chip on the cooling element. In a second configuration, the electronic component comprises at least two cooling elements. At least one semiconductor chip is placed on the cooling element. Two, three, or more semiconductor chips may be placed on the cooling element. Moreover, the semiconductor chips may be positioned in a stack with one semiconductor chip placed above another semiconductor chip.

A layer of second adhesive or chip adhesive may be placed on the top surface of the cooling element. The second adhesive bonds the semiconductor chip onto the cooling element.

A layer of third adhesive may be placed on the top surface of the semiconductor chip. The third adhesive bonds the semiconductor chip and the semiconductor chip that is placed above the semiconductor chip.

Furthermore, the second and the third adhesive may comprise the same or different types of material depending on the need of the application.

Electrical contacts such as bonding wires or conductive wires may be provided between the leads and the semiconductor chip. The electrical contacts provide electrical paths between external electrical circuits connected to the leads and electronic circuits of the semiconductor chip.

The electrical contacts may also be provided between two semiconductor chips that are adjacent to each other. The electrical contacts provide electrical paths between electronic circuits of the semiconductor chip and electronic circuits of the adjacent semiconductor chip.

The cooling element usually comprises a material that has good thermal conductivity, such as a metallic material, a ceramic material, or a semiconductor material. The cooling element that comprises a ceramic material is known as a ceramic pad, while the cooling element that comprises a semiconductor material wafer is known as wafer. The semiconductor material may include a layer of gold or silver at its bottom surface. Part of the bottom surface of the cooling element may be flat and may have at least one channel formed on the bottom surface. The channel increases the surface area of the bottom surface, which in turn typically enhances thermal conductivity of the cooling element.

The electronic component may further comprise a carrier element. Such a carrier element can have the form of a tape pad or a plastic layer. The leads and at least one cooling element are mounted on the carrier element for the later step of package encapsulation. The carrier element is removed from the electronic component after package encapsulation.

The carrier element may comprise a material that tolerates temperatures of 200 degrees Celsius. This allows the carrier element to tolerate an elevated temperature of a molten encapsulation compound during package encapsulation.

A layer of first adhesive or tape adhesive may be provided on the top surface of the carrier element. The first adhesive bonds the leads and the at least one cooling element onto the carrier element.

In an embodiment, an electronic component comprises a plurality of outer contacts, two or more heat sinks, each having a first surface and a second surface opposing the first surface, two or more semiconductor devices, and an encapsulation compound providing a component package and having a first outer surface and a second outer surface opposing the first outer surface. The second surfaces of the two or more heat sinks are exposed from the encapsulation compound and are generally parallel to the second surface of the encapsulation compound.

The outer contacts may be provided in the form of pins, leadfingers, solder balls, or surface mountable contacts in the form of leads.

In an embodiment, the plurality of outer contacts and the second surfaces of the two or more heat sinks are generally coplanar. The electronic component may be a leadless package. The second surfaces of the two or more heat sinks may be mountable. More particularly, the second surfaces of the two or more heat sinks may be mountable on a higher level substrate such as a redistribution board which may have the form of a printed circuit board. The second surfaces of the heat sinks of the electronic component may be mounted on external heat sinks of cooling elements of the printed circuit board. A bondable coating may be provided on the second surfaces of the two or more heat sinks to enable the second surfaces to be mounted on the higher level circuit board. The bondable layer may be a surface which is wettable by soft solder or may be a soft solder layer or an adhesive layer. The adhesive may be electrically and/or thermally conductive.

In an embodiment, at least one of the two or more heat sinks comprises a material which is different from the material of the remaining heat sinks. More particularly, one heat sink may be a ceramic, whereas the remaining heat sinks of the electronic component comprise a metal. Furthermore, the shapes of the two or more heat sinks may be different. A first heat sink may be provided with protrusions or fins in the second surface, whereas a second heat sink may be provided with an even second surface.

An electronic component is provided in which each heat sink, in terms of its thermal dissipation capabilities, cost, and electrical resistive properties, is adapted for one of the semiconductor devices of the electronic component. The overall heat dissipation from the electronic component may be improved.

The electronic component may be manufactured by providing a carrier comprising a plurality of outer contacts positioned on a first surface, providing two more heat sinks each having a first surface and a second surface opposing the first surface, wherein at least one semiconductor device is positioned on the first surface of the two or more heat sinks, positioning the second surface of the two or more heat sinks on the first surface of the carrier, and embedding at least portions of the outer contacts, portions of the two or more heat sinks and portions of the first surface of the carrier element in an encapsulation compound.

The electronic component is assembled on a carrier which may have the form of a foil such as an adhesive foil. Individual heat sinks are mounted on the carrier. The components of the electronic component which are attached to the first surface of the carrier, such as the first surfaces of the heat sinks, the semiconductor devices and internal electrical connections are encapsulated by the encapsulation compound. This may be carried out by an overmolding process. Consequently, the heat sinks of a single electronic component may comprise different materials, such as a ceramic or a metal or comprise different metals within the electronic component, such as copper and aluminum. This is in contrast to a leadframe based package which comprises a die pad or die pads in which the die pads providing the heat sinks are of the same material as the leads of the leadframe and, if two or more die pads which provide a heat sink are provided, the two or more die pads comprise the same material.

The method may further comprise removing the carrier to provide an electronic component comprising a package housing of encapsulation compound. The second surface of the two or more heat sinks is exposed from the encapsulation compound. The surface of the outer contacts, which was attached to the first surface of the carrier, is also exposed from the encapsulation compound. The method may be used to provide leadless packages.

In a further embodiment, the second surfaces of the two or more heat sinks are positioned on the first surface of the carrier and, afterwards, the semiconductor devices are attached to the first surfaces of the two or more heat sinks.

Alternatively, the semiconductor devices are first provided with respective heat sinks, and the heat sinks with the attached semiconductor device are positioned on the carrier. The heat sink may be provided for a plurality of semiconductor devices at the wafer level.

A method of fabricating an electronic component comprises providing a carrier element. Then, a layer of first adhesive may be placed on a top surface of the carrier element or carrier or tape pad. After this, at least one cooling elements or heat sink and a plurality of leads are placed on the top surface of the carrier element. Next, a layer of second adhesive may be provided on a top surface of the at least one cooling element. Following this, at least one semiconductor chip is provided on the top surface of the at least one cooling element.

Then, a third adhesive may be placed on a top surface of the semiconductor chip. After this, a plurality of electrical contacts are attached between the leads and at least one semiconductor chip. The electrical contacts may also be connected between the semiconductor chip and an adjacent semiconductor chip. Then, an encapsulation compound covers at least part of the leads, at least part of the at least one semiconductor chip, and at least part of the at least one cooling element.

The encapsulation compound is molten during package encapsulation. The flow of the molten compound typically exerts a shifting force on the leads, the semiconductor chip, and the cooling element. The first adhesive, the second adhesive, and the third adhesive typically fix the leads, the semiconductor chip, and the cooling element onto the carrier element and prevent them from shifting during package encapsulation.

The conventional mechanism for filling the mold with encapsulation compound during package encapsulation of the electronic component may suffer from incomplete filling of encapsulation compound that is triggered by a difference in the encapsulation compound flow speed between the encapsulation compound above and the encapsulation compound below a semiconductor chip. An electronic component with an exposed heat sink does not suffer from this, as there is no encapsulation compound below the semiconductor chip.

After this, the carrier element is removed from the encapsulation compound. This exposes the bottom surface of the cooling element. The exposed surface generally enhances thermal conductivity of the cooling element.

Specific embodiments will now be described in connection with the drawings. FIG. 1 illustrates a cross sectional view of an electronic component 21. FIG. 1 shows a tape pad 9 with a layer of tape adhesive 8 on its top surface. A plurality of leads 2 and a first heat sink 5 are placed on the top surface of the tape pad 9. A semiconductor chip 3 is positioned on the first heat sink 5.

The layer of tape adhesive 8 is interposed between the tape pad 9 and the first heat sink 5 and the leads 2 attaching the heat sink 5 and the leads 2 to the tape pad 9. A layer of chip adhesive 4 is provided between the heat sink 5 and the semiconductor chip 3 attaching the semiconductor chip 3 to the heat sink 5. Several channels 17 are provided on the bottom surface of the heat sink 5. The heat sink 5 comprises an aluminum material.

The semiconductor chip 3 comprises electrical circuitry and contact pads connected to the electrical circuitry. The electrical circuitry and the contact pads are not shown in the figures. Conductive wires 10 are connected between the contact pads and leads 2.

Figure 2:
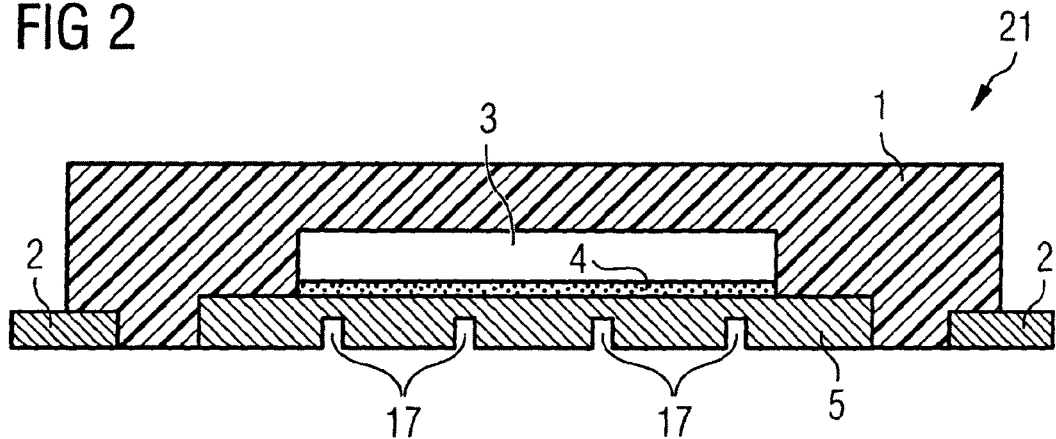
FIG. 2 illustrates a cross-sectional view of the electronic component of FIG. 1 in a later process step.

FIG. 2 illustrates the electronic component 21 of FIG. 1 in a later process step. An encapsulation compound 1 covers the semiconductor chip 3, the heat sink 5, the wires 10 and the leads 2. The tape pad 9 and the tape adhesive 8 of FIG. 1 have been removed from the electronic component 21. This removal exposed the bottom surface of the heat sink 5.

The material of the heat sink 5 is different from the material of the leads 2. The heat sink 5 comprises aluminum material that has good thermal conductivity.

The semiconductor chip 3 generates heat when operational. This heat is dissipated by the heat sink 5. The bottom surface of the heat sink 5 is exposed to the atmosphere, which differs from conventional practice. In conventional practice, the bottom surface of the heat sink 5 is coated with an encapsulation compound 1. This coating hinders the transfer of heat from the heat sink 5 to the atmosphere.

In a special embodiment, the bottom surface of heat sink 5 is attached to an external heat sink. The external heat sink further enhances the heat dissipation of the heat sink 5.

The heat sink 5 comprises channels 17 on the bottom surface of the heat sink 5. The channels 17 increase the surface area of the bottom surface, which in turn further enhances the heat dissipation of the heat sink 5.

The encapsulation compound 1 shields and holds together the parts of the electronic component 21. The parts include the semiconductor chip 3, the heat sink 5, the leads 2, and the wires 10.

The chip adhesive 4 provides bonding and thermal conductivity between the semiconductor chip 3 and the first heat sink 5. The tape adhesive 8 binds the heat sink 5 and the leads 2 to the tape pad 9. The adhesive 8 comprises adhesive that weakens in its adhesive property when heated. In another embodiment, the adhesive 8 comprises adhesive that weakens in its adhesive property when irradiated with ultraviolet light. This feature of the adhesive provides an easy means to remove the tape pad 9 from the electronic component 21.

The tape pad 9 comprises a polymer material that tolerates temperatures of 200° C. (degrees Celsius) and has a high tensile modulus of about 5,000 megapascal. Molten encapsulation compound covers the top surface of the tape pad 9 during package encapsulation. Molten encapsulation compound has a temperature of approximately 170° C. The high tensile modulus of the tape pad 9 keeps it stiff and prevents the parts that are attached to it from shifting.

The leads 2 are intended for later mounting onto an external substrate such as a printed circuit board. The lead acts as a terminal for the transfer of electrical signal between the semiconductor chip 3 and the external substrate.

The electronic component 21 is fabricated by placing a layer of tape adhesive 8 on a tape pad 9.

Following this, a layer of chip adhesive 4 is deposited on a heat sink 5.

After this, a semiconductor chip 3 is provided on heat sink 5. The adhesive 4 bonds the chip 3 onto the heat sink 5.

Then, leads 2 and the heat sink 5 are placed onto the tape pad 9.

The placement is done by machine for accurate positioning. An operator inputs the heat sink 5 planned position into the machine. Any change of heat sink 5 position can easily be done by programming the new position into the machine. The adhesive 8 bonds the leads 2 and the heat sink 5 onto the tape pad 9.

Following this, a plurality of wires 10 are attached between the chip 3 and the leads 2.

The accurate positioning of the leads 2 and the heat sink 5 facilitates the machine attachment of the wires 10. The adhesive 8 prevents the leads 2 and the heat sink 5 from shifting during this step.

After this, an encapsulation compound 1 is placed over the chip 3, the heat sink 5, the wires 10, and the leads 2.

The encapsulation compound 1 is in a molten state during this step. The flow of molten compound 1 exerts a shifting force onto the chip 3, the heat sink 5, and the leads 2. The adhesives 8 and 4 prevent the chip 3, the heat sink 5, and the leads 2 from shifting. The pad 9 comprises a material that tolerates the high temperature of the molten compound 1. The pad 9 has a high tensile modulus that keeps the pad stiff. The stiff pad 9 inhibits the chip 3, the heat sink 5, and the leads 2 from shifting.

Then, the tape pad 9 is removed from the electronic compound 21.

The tape pad 9 is removed by applying heat to it to weaken the adhesive property of the tape adhesive 8. The adhesive 8 comprises an adhesive that weakens in adhesion when heated. The removal of the pad 9 exposes the heat sink 5 to the atmosphere.

Figure 3:
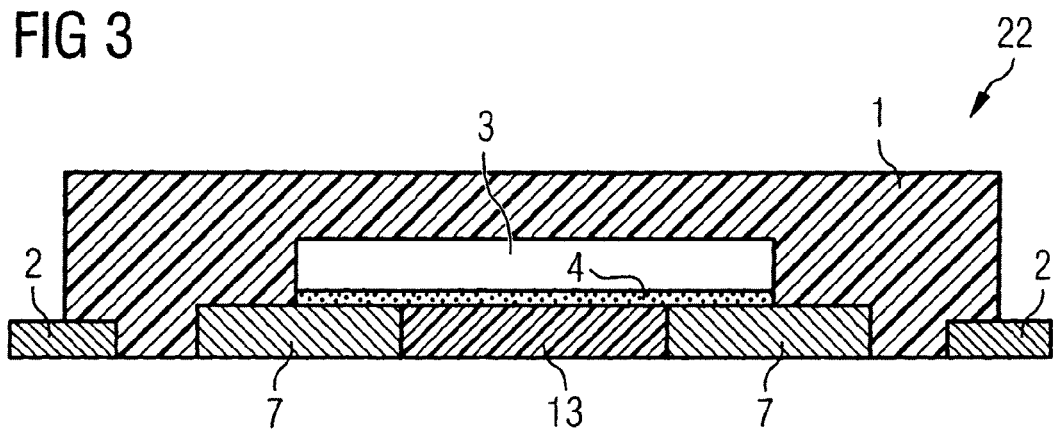
FIG. 3 illustrates a cross-sectional view of an electronic component with a second heat sink.

FIG. 3 illustrates a cross-sectional view of an electronic component 22 with a second heat sink 7. FIG. 3 shows features similar to those shown in the FIGS. 1 and 2. The similar features are denoted with the same reference numerals and are detailed in the FIGS. 1 and 2 descriptions.

FIG. 3 illustrates a second heat sink 7 that is attached to the bottom surface of the semiconductor chip 3. The heat sink 7 is separated into two portions by a gap 13 that is in the middle of the heat sink 7. The gap 13 reduces the stress generated by the thermal expansion mismatch between the chip 3 and the heat sink 7. The heat sink 7 comprises an aluminum material that has good thermal conductivity.

Figure 4:
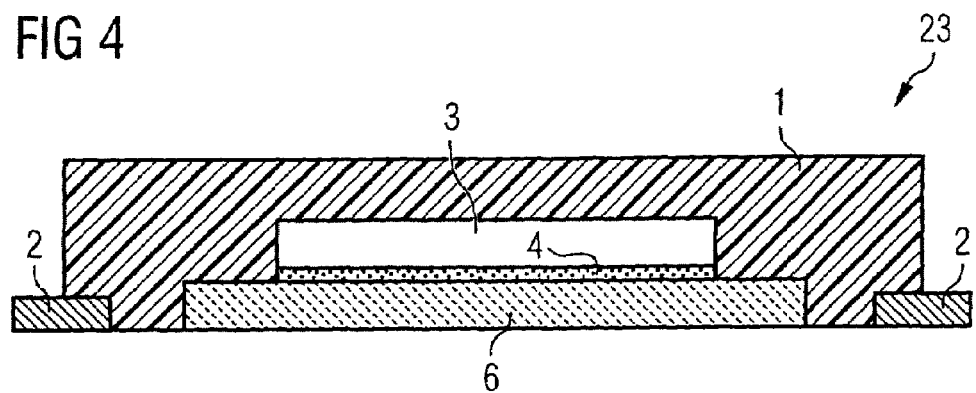
FIG. 4 illustrates a cross-sectional view of a electronic component with a ceramic pad.

FIG. 4 illustrates a cross-sectional view of an electronic component 23 with a ceramic pad 6. FIG. 4 shows features similar to those shown in the FIGS. 1 and 2. The similar features are denoted with the same reference numerals and are discussed in detail with reference to FIGS. 1 and 2 descriptions.

FIG. 4 illustrates a ceramic pad 6 that is attached to the bottom surface of the semiconductor chip 3. The ceramic pad 6 is a type of heat sink or cooling element. The ceramic pad 6 has a rectangular cross-section. The bottom surface of the ceramic pad 6 is exposed to the atmosphere.

FIGS. 1 to 4 illustrate a heat sink attached to the semiconductor chip 3. In another embodiment, the heat sink comprises other shapes that differ from the shape shown in the FIGS. 1 to 4.

Figure 5:
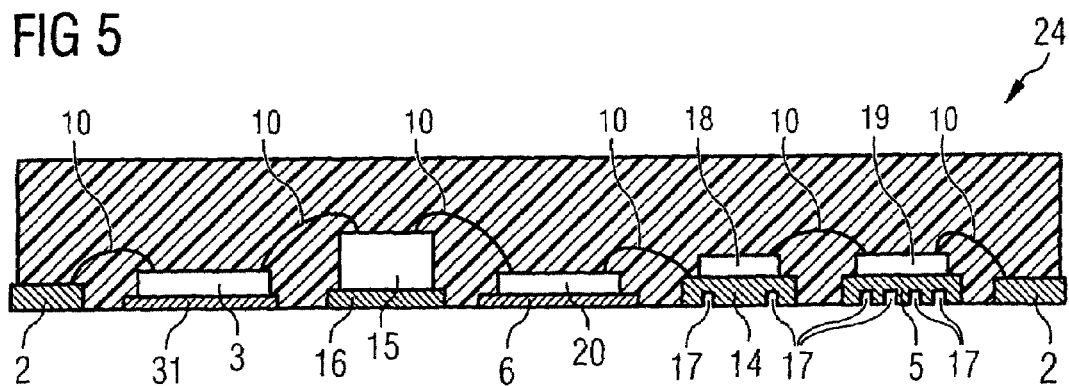
FIG. 5 illustrates a cutaway cross-sectional view of a first multi-chip electronic component.

FIG. 5 illustrates a cutaway cross-sectional view of a first multi-chip electronic component 24. FIG. 5 illustrates features similar to those shown in the FIGS. 1, 2, and 4. Similar features are denoted with the same reference numerals and are described in detail with reference to the description of FIGS. 1, 2 and 4.

The component 24 includes leads 2, semiconductor chips 3, 15, 18, 19, and 20, and conductive wires 10.

The left portion of FIG. 5 shows the leads 2. The semiconductor chip 3 is placed to the right of the leads 2. A fourth heat sink 31 is located on the bottom surface of the chip 3. The bottom surface of the heat sink 31 is flat and is exposed to the atmosphere. The heat sink 31 comprises an aluminum material. Wires 10 are attached between the leads 2 and the contact pads of the chip 3. The contact pads are not shown in the figures.

A second semiconductor chip 15 is placed to the right of and adjacent to the semiconductor chip 3. A semiconductor wafer 16 is positioned on the bottom surface of the second semiconductor chip 15. The bottom of wafer 16 is flat and is exposed to the atmosphere. Moreover, the bottom surface of the wafer 16 is coated with a layer of gold. The layer of gold is not shown in the figure. The bottom surface of the wafer 16 is exposed to the atmosphere. The wires 10 are connected between contact pads of the chip 3 and contact pads of second semiconductor chip 15. The contact pads of the semiconductor chips 3 and 15 are not shown in the figures.

To the right of and adjacent to the second semiconductor chip 15 is located the third semiconductor chip 20. A ceramic pad 6 is provided at the bottom of the third semiconductor chip 20. The bottom surface of the pad 6 is flat and is exposed to the atmosphere. The wires 10 are connected between the contact pads of the third and second semiconductor chips 20 and 15. The contact pads are not shown in the figures.

The fourth semiconductor chip 18 is placed to the right of and adjacent to the third semiconductor chip 20. A third heat sink 14 is provided below the fourth semiconductor chip 18. The bottom of heat sink 14 has channels 17 that are similar to the channels 17 of the FIG. 2. The channels 17 are exposed to the atmosphere. The bottom surface of the heat sink 14 is exposed to the atmosphere. The heat sink 14 comprises an aluminum material. The wires 10 are connected between contact pads of the third semiconductor chip 20 and the heat sink 14. The contact pads are not shown in the figures. The wires 10 allow the third semiconductor chip 20 to be connected to a ground source through the heat sink 14 during a user application.

The fifth semiconductor chip 19 is placed to the right of and adjacent to the fourth semiconductor chip 18. The first heat sink 5 is provided on the bottom surface of the fifth semiconductor chip 19. The bottom of the heat sink 5 is exposed to the atmosphere. The channels 17 are formed on the bottom surface of the heat sink 5. The wires 10 are connected between contact pads of the fourth semiconductor chip 18 and contact pads of fifth semiconductor chip 19. The contact pads are not shown in the figures.

The leads 2 are placed to the right of the fifth semiconductor chip 19. The wires 10 are connected between contact pads of the fifth semiconductor chip 19 and the leads 2.

An encapsulation compound 1 covers the leads 2, semiconductor chips 3, 15, 18, 19, and 20, and wires 10. The bottom surface of the compound 1 is flat and aligned with the bottom surfaces of the leads 2, heat sinks 5, 14 and 31, wafer 16, and ceramic pad 6.

The electronic component 24 is fabricated by placing a layer of tape adhesive 8 on a tape pad 9 of FIG. 1. Then, a layer of chip adhesive 4 is deposited on a heat sink 31, and a semiconductor chip 3 is provided on heat sink 31. The adhesive 4 is not shown in the figure. Following this, a layer of adhesive 4 is provided on a wafer 16, and a second semiconductor chip 15 is placed on the wafer 16. After this, a layer of adhesive 4 is placed on a ceramic pad 6, and a third semiconductor chip 20 is provided on the ceramic pad 6. Following this, a layer of adhesive 4 is deposited on a third heat sink 14, and a fourth semiconductor chip 18 is placed on the heat sink 14. Then, a layer of adhesive 4 is provided on a first heat sink 5, and a fifth semiconductor chip 19 is placed on the heat sink 5. Following this, the heat sinks 5, 14, and 31, the wafer 16, and the ceramic pad 6 are placed onto the tape pad 9.

After this, a plurality of wires 10 are attached between the contact pads of the chip 3 and the leads 2, between the contact pads of semiconductor chips 3 and 15 and between the contact pads of semiconductor chips 15 and 20. The wires are connected between the contact pads of chip 20 and heat sink 14, between the contact pads of semiconductor chips 18 and 19, and between the contact pads of fifth semiconductor chips 19 and the leads 2. The contact pads are not shown in the figure. Following this, an encapsulation compound 1 is deposited over the semiconductor chips 3, 15, 18, 19, and 20, the wires 10, and the leads 2. Then, the tape pad 9 is removed from the electronic compound 24.

Figure 6:
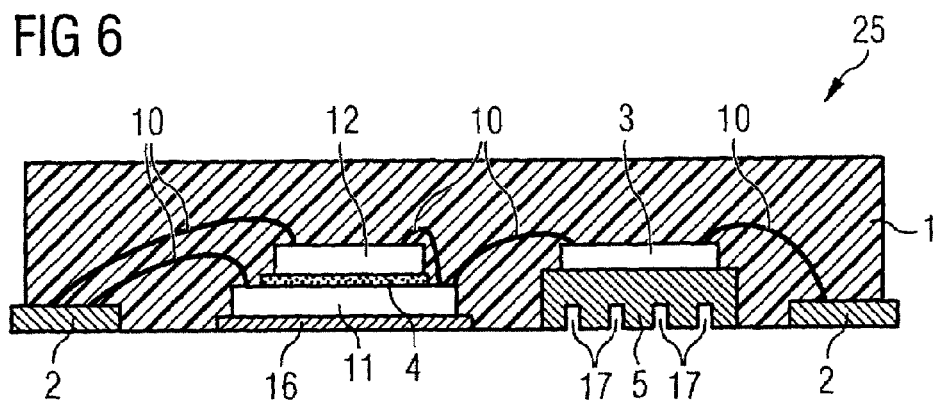
FIG. 6 illustrates a cutaway cross-sectional view of a second multi-chip electronic component.

FIG. 6 illustrates a cutaway cross-sectional view of a second multi-chip electronic component 25. FIG. 6 shows features similar to those shown in the FIGS. 1 and 2. The similar features are denoted with the same reference numerals and are described in detail with reference to the description of FIGS. 1 and 2.

The component 25 includes leads 2, wires 10, semiconductor chips 3, 11, and 12, heat sink 5, and wafer 16. An encapsulation compound 1 covers the leads 2, the wires 10, the semiconductor chips 3, 11 and 12, the heat sink 5, and the wafer 16.

The leads 2 are placed in the left outer region of the component 25. To the right of the leads 2 is provided the wafer 16. The bottom surface of the wafer 16 is flat and is exposed to the atmosphere. On the wafer 16 is placed the bottom semiconductor chip 11. There is a layer of chip adhesive 4 interposed between the wafer 16 and the bottom semiconductor chip 11. The adhesive 4 is not shown in the figure. On top of the bottom semiconductor chip 11 is deposited a layer of chip adhesive 4.

A top semiconductor chip 12 is placed above the adhesive 4 and the bottom semiconductor chip 11. The semiconductor chips 11 and 12 comprise interconnected electrical circuits and contact pads. The contact pads and electrical circuits are not shown in the figure. The wires 10 are attached between the leads 2 and the contact pads of the bottom semiconductor chip 11 and between the leads 2 and the contact pads of the top semiconductor chip 12. The wires 10 are connected between the contact pads of semiconductor chips 11 and 12.

A first heat sink 5 is located on the right of the semiconductor chip 12. A semiconductor chip 3 is positioned on the heat sink 5. The bottom of the heat sink 5 is exposed to the atmosphere. There is a layer of chip adhesive 4 positioned between the heat sink 5 and the semiconductor chip 3. The adhesive 4 is not shown in the figure. The wires 10 are connected between the contact pads of the semiconductor chips 3 and 11. The contact pads are not shown in the figure.

To the right of the heat sink 5 is provided the leads 2. The wires 10 are attached between the leads 2 and the contact pads of the chip 3. The contact pads are not shown in the figure.

The electronic component 25 is fabricated by placing a layer of tape adhesive 8 on a tape pad 9 of FIG. 1. Then, a layer of chip adhesive 4 is deposited on a wafer 16. The adhesive 4 is not shown in the figure. After this, a semiconductor chip 11 is provided on the wafer 16. Next, a layer of adhesive 4 is deposited on the chip 11. Following this, a semiconductor chip 12 is placed on the chip 11. Then, a layer of adhesive 4 is provided on a heat sink 5. After this, a semiconductor chip 3 is placed on the heat sink 5. Following this, the wafer 16 and the heat sink 5 are placed onto the tape pad 9.

Then, wires 10 are attached between the leads 2 and the contact pads of the chips 11 and between the leads 2 and the contact pads of the chips 12. The wires 10 are connected between the contact pads of the chips 11 and 12 and between contact pads of chips 11 and 3. The wires 10 are bonded between the contact pads of the chip 3 and the leads 2. After this, the leads 2, the wires 10 and the chips 11, 12 and 3 are covered with an encapsulation compound 1. Following this, the tape pad 9 is removed from the component 25.

While the invention has been described in detail with reference to specific embodiments thereof, it will be apparent to one of ordinary skill in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. An electronic component, comprising:
    a plurality of leads;
    at least one cooling element comprising a bottom surface that is exposed, wherein the material of the at least one cooling element is different from the material of the leads;
    at least one semiconductor chip mounted on a surface of the at least one cooling element, the surface comprising the material of the at least one cooling element that is different from the material of the leads; and
    an encapsulation compound that covers at least part of the leads, at least part of the at least one semiconductor chip, and at least part of the at least one cooling element.

2. The electronic component according to claim 1, wherein the electronic component comprises two or more cooling elements and at least one semiconductor chip on each of the cooling elements.

3. The electronic component according to claim 1, wherein two or more semiconductor chips are provided on at least one cooling element.

4. The electronic component according to claim 1, wherein two or more semiconductors are positioned in a stack.

5. The electronic component according to claim 1, wherein the at least one cooling element comprises at least one of: a metallic material, a ceramic material, and a semiconductor material.

6. An electronic component according to claim 1, comprising:
    a plurality of leads;
    at least one cooling element comprising a semiconductor material and a layer of gold or silver positioned on an exposed bottom surface of the semiconductor material;
    at least one semiconductor chip on the at least one cooling element; and
    an encapsulation compound that covers at least part of the leads, at least part of the at least one semiconductor chip, and at least part of the at least one cooling element,
    wherein the material of the at least one cooling element is different from the material of the leads.

7. The electronic component according to claim 1, wherein the at least one cooling element has at least one channel formed on its bottom surface.

8. The electronic component according to claim 1, wherein the electronic component further comprises a carrier element, the leads and the at least one cooling element being mounted on the carrier element.

9. The electronic component according to claim 8, wherein the electronic component further comprises a layer of first adhesive on a top surface of the carrier element, the first adhesive bonding the carrier element onto the leads and onto the at least one cooling element.

10. An electronic component, comprising:
    a plurality of outer contacts;
    two or more heat sinks, each having a first surface and a second surface opposing the first surface, wherein at least one of the two or more heat sinks comprises a material that is different from the material of others of the two or more heat sinks;
    two or more semiconductor devices; and
    an encapsulation compound providing a component package and having a first outer surface and a second outer surface opposing the first outer surface,
    wherein the second surfaces of the two or more heat sinks are exposed from the encapsulation compound and are generally parallel to the second surface of the encapsulation compound.

11. The electronic component according to claim 10, wherein the plurality of outer contacts and the second surfaces of the two or more heat sinks are generally coplanar.

* * * * *